United States Patent
Lee (10) Patent No.: US 11,735,222 B2
(45) Date of Patent: Aug. 22, 2023

(54) FRAME BUFFER COMPRESSING CIRCUITRY AND IMAGE PROCESSING APPARATUS

(71) Applicant: Samsung Electronics Co., Ltd., Suwon-si (KR)

(72) Inventor: Kyung Koo Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 56 days.

(21) Appl. No.: 17/375,666

(22) Filed: Jul. 14, 2021

(65) Prior Publication Data

US 2022/0036922 A1    Feb. 3, 2022

(30) Foreign Application Priority Data

Jul. 31, 2020   (KR) .................. 10-2020-0095686

(51) Int. Cl.
| | | |
|---|---|---|
| *G11B 20/10* | (2006.01) | |
| *G11B 20/00* | (2006.01) | |
| *H04N 19/91* | (2014.01) | |
| *H04N 19/124* | (2014.01) | |

(52) U.S. Cl.
CPC .. *G11B 20/10527* (2013.01); *G11B 20/00007* (2013.01); *H04N 19/124* (2014.11); *H04N 19/91* (2014.11); *G11B 2020/00072* (2013.01)

(58) Field of Classification Search
CPC ........ G11B 20/10527; G11B 20/00007; G11B 2020/00072; H04N 19/124; H04N 19/91
See application file for complete search history.

(56) References Cited

U.S. PATENT DOCUMENTS

| | | |
|---|---|---|
| 8,031,937 B2 | 10/2011 | Rasmusson et al. |
| 10,225,569 B2 | 3/2019 | Okamoto et al. |
| 10,268,380 B2 | 4/2019 | Arelakis et al. |
| 2010/0060629 A1 | 3/2010 | Rasmusson et al. |
| 2010/0232721 A1* | 9/2010 | Yang .................... H04N 19/172 375/240.03 |
| 2011/0191653 A1* | 8/2011 | Zeng .................. H03M 13/1111 714/763 |

(Continued)

FOREIGN PATENT DOCUMENTS

| | | |
|---|---|---|
| CN | 110087074 A | 8/2019 |
| KR | 100248190 B1 | 3/2000 |
| KR | 101829262 B1 | 2/2018 |

*Primary Examiner* — Sunghyoun Park
(74) *Attorney, Agent, or Firm* — Harness, Dickey & Pierce, P.L.C.

(57) ABSTRACT

An image processing apparatus includes a memory configured to store compressed data; and frame buffer compressing circuitry which includes encoder circuitry configured to compress at least some of source data to generate the compressed data and transmit the compressed data to the memory, and decoder circuitry configured to read and decompress the compressed data from the memory, in which the compressed data includes a payload and a header including actual compressed data and flag, the frame buffer compressing circuitry is configured to reflect a result obtained by comparing an accumulated compressibility corresponding to the compressed data with a reference compressibility in the flag, and is configured to perform compression or decompression in a lossy mode or a lossless mode depending on the flag.

20 Claims, 8 Drawing Sheets

(56) References Cited

U.S. PATENT DOCUMENTS

| | | | |
|---|---|---|---|
| 2011/0317772 A1* | 12/2011 | Inohiza | H04L 69/14 |
| | | | 375/E7.026 |
| 2012/0290798 A1* | 11/2012 | Huang | G06F 12/0246 |
| | | | 711/E12.001 |
| 2014/0195500 A1* | 7/2014 | Amit | G06F 16/2365 |
| | | | 707/693 |
| 2014/0219558 A1* | 8/2014 | Teng | G06T 9/00 |
| | | | 382/166 |
| 2019/0215519 A1* | 7/2019 | Huang | H04N 19/152 |
| 2019/0238894 A1 | 8/2019 | Jun et al. | |
| 2020/0236328 A1* | 7/2020 | Drako | H04N 19/80 |
| 2021/0075440 A1* | 3/2021 | Chen | H03M 7/607 |

\* cited by examiner

| 1st Block (1st Block) >=K | 2nd Block (1st+2nd Block) >=K | 3rd Block (1st+2nd+3rd Block) >=K | | |
|---|---|---|---|---|
| | | | Nth Block (1st+2nd+3rd +...+ Nth) >=K | |
| | | | | |

FRAME BUFFER COMPRESSING CIRCUITRY AND IMAGE PROCESSING APPARATUS

CROSS-REFERENCE TO RELATED APPLICATION

This application claims priority from Korean Patent Application No. 10-2020-0095686 filed on Jul. 31, 2020 in the Korean Intellectual Property Office, and all the benefits accruing therefrom under 35 U.S.C. 119, the contents of which in its entirety are herein incorporated by reference.

BACKGROUND

1. Field

The present inventive concepts relate to an image processing apparatus.

2. Description of the Related Art

With the rise of need for a video high-resolution image and a high-frame rate image, an amount in which various multi-media IP of an image processing apparatus access a memory, that is, a bandwidth increases significantly.

When the bandwidth increases, processing capacity of the image processing apparatus reaches the limit, which may cause a problem of a decrease in speed at the time of recording or play-back operation of the video image.

Accordingly, a type of compressing the size of data when the multi-media IP accesses the memory is being considered. For example, the data may be compressed before the data are written on the memory, and the compressed data may be decompressed before the data are read from the memory.

SUMMARY

Aspects of the present inventive concepts provide an image processing apparatus having improved image quality and/or resolution, and frame buffer compressing circuitry used in the image processing apparatus.

One aspect of the present inventive concepts provides an image processing apparatus including a multi-media IP which processes raw data to generate source data, and receives and uses output data, frame buffer compressing circuitry which operates in a lossy mode or a lossless mode to compress the source data into compressed data or decompress the compressed data into the output data and a memory which stores the compressed data and is accessed by the multi-media IP, wherein the frame buffer compressing circuitry selects the lossy mode or the lossless mode on the basis of an accumulated compressibility of the compressed data and performs compression or decompression based on the selected mode.

Another aspect of the present inventive concepts provides frame buffer compressing circuitry including encoder circuitry which receives source data and generates compressed data and decoder circuitry which decompresses the compressed data and outputs the output data, wherein the encoder circuitry performs compression in a lossy mode when an accumulated compressibility of the compressed data exceeds a reference compressibility, and otherwise, the encoder circuitry performs compression in a lossless mode, and wherein the decoder circuitry performs decompression according to a compression mode corresponding to the compressed data.

Other aspect of the present inventive concepts provides an image processing apparatus including a memory which stores compressed data and frame buffer compressing circuitry which includes encoder circuitry configured to compress at least some of source data to generate the compressed data and transmit the compressed data to the memory, and decoder circuitry configured to read and decompress the compressed data from the memory, wherein the compressed data includes a payload and a header including actual compressed data and flag, wherein the frame buffer compressing circuitry reflects a result obtained by comparing an accumulated compressibility corresponding to the compressed data with a reference compressibility in the flag, and performs compression or decompression in a lossy mode or a lossless mode depending on the flag.

However, aspects of the present inventive concepts are not restricted to the one set forth herein. These and other aspects of the present inventive concepts will become more apparent to one of ordinary skill in the art to which the present inventive concepts pertain by referencing the detailed description of the present inventive concepts given below.

DETAILED DESCRIPTION OF EXAMPLE EMBODIMENTS

Hereinafter, an image processing apparatus according to some example embodiments of the present inventive concepts will be described referring to FIGS. 1 to 13.

Figure 1:
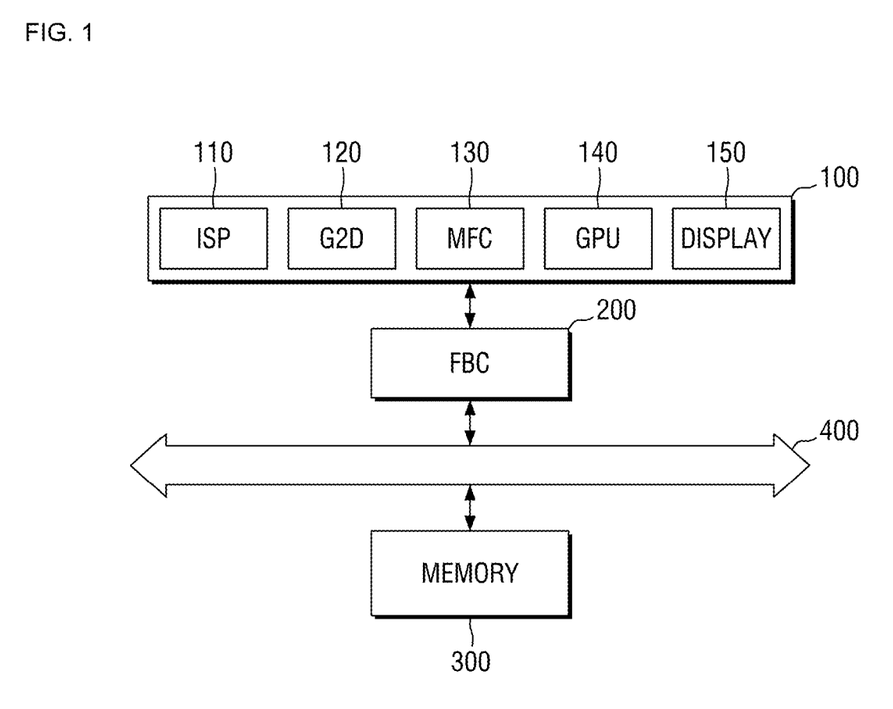
FIG. 1 is a block diagram for explaining an image processing apparatus according to some example embodiments of the present inventive concepts.
Figure 2:
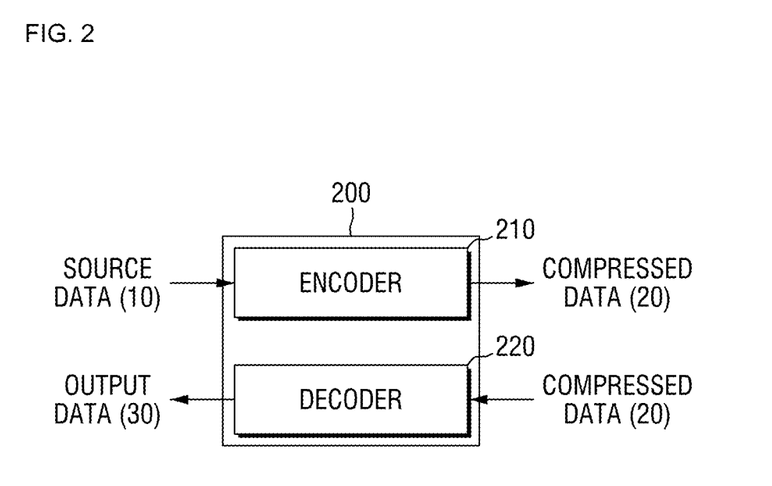
FIG. 2 is a block diagram for explaining a frame buffer compressor of FIG. 1 in detail.

FIG. 1 is a block diagram for explaining an image processing apparatus according to some example embodiments of the present inventive concepts, and FIG. 2 is a block diagram for explaining a frame buffer compressor of FIG. 1 in detail.

Referring to FIGS. 1 and 2, the image processing apparatus according to some example embodiments of the present inventive concepts includes a multi-media IP (Intellectual Property) 100, a frame buffer compressor 200, a memory 300, and/or a system bus 400.

The multi-media IP 100 may be a part that directly performs the image processing of the image processing apparatus. That is, the multi-media IP 100 may mean various modules for recording and playing back an image, such as camcoding and playback of a video image.

The multi-media IP 100 may receive raw data from outside such as a camera and convert the raw data into source data 10. At this time, the raw data may be moving image or image raw data. The source data 10 may also include data generated by the multi-media IP 100 and being processed by the multi-media IP 100. That is, the multi-media IP 100 may repeat the process of storing the data obtained by processing the raw data via several operations in the memory 300 and updating the data again. The source data 10 may include all the data during this operation. However, because the source data 10 may be stored in the form of compressed data 20 when stored in the memory 300, the source data 10 in the memory 300 may mean data before stored in the memory 300 or after read from the memory 300. This will be explained below in more detail.

For example, the multi-media IP 100 may include an image signal processor (ISP) 110, an image stabilization module (G2D) 120, a multi-format codec (MFC) 130, a GPU 140 and/or a display 150. However, example embodiments are not limited thereto. That is, the multi-media IP 100 may include at least some of the image signal processor 110, the image stabilization module 120, the multi-format codec 130, the GPU 140 and the display 150 mentioned above. That is, the multi-media IP 100 may mean a processing module that needs to access the memory 300 to process a moving image or an image.

The image signal processor 110 may receive and preprocess the raw data, and convert the raw data into the source data 10. At this time, the raw data may be an RGB type image raw data. For example, the image signal processor 110 may convert the RGB type raw data into YUV type source data 10.

At this time, the RGB type data means a data format in which colors are expressed on the basis of three primary colors of light. That is, it is a type of expressing an image, using three kinds of colors of red, green, and blue. On the contrary, the YUV type means a data format in which brightness, that is, a luma signal and a chroma signal are expressed separately. That is, Y means a luma signal, and U(Cb) and V(Cr) mean chroma signals, respectively. U means a difference between the luma signal and the blue signal component, and V means a difference between the luma signal and the red signal component.

The YUV type format data may be acquired by being converted from the RGB type format data, using conversion formulas such as $Y=0.3R+0.59G+0.11B$, $U=(B-Y)\times0.493$, $V=(R-Y)\times0.877$.

Because the human eye is sensitive to the luma signals but are less sensitive to the color signals, the YUV type data may be compressed more easily than the RGB type data. As a result, the image signal processor 110 may convert the RGB type raw data into the YUV type source data 10.

The image signal processor 110 may convert the raw data into the source data 10 and then store the source data in the memory 300.

The image stabilization module 120 may perform image stabilization of image and the moving image data. The image stabilization module 120 may perform image stabilization, by reading the raw data or the source data 10 stored in the memory 300. At this time, the image stabilization means an operation of detecting and removing the shaking of the camera from the moving image data.

The image stabilization module 120 may correct the shaking of the raw data or source data 10, generate or update new source data 10, and store it in the memory 300.

The multi-format codec 130 may be a codec that compresses the moving image data. In general, because the moving image data has very large size, a compression module for reducing the size thereof is required. The moving image data can be compressed through correlations between a plurality of frames, and compression of the moving image data may be performed by the multi-format codec 130. The multi-format codec 130 may read and compress the raw data or the source data 10 stored in the memory 300.

The multi-format codec 130 may compress the raw or source data 10 to generate new source data 10 or update the source data 10 and may store it in the memory 300.

The GPU (Graphics Processing Unit) 140 may process and generate 2D or 3D graphics. The GPU 140 may perform arithmetic processing on the raw data or the source data 10 stored in the memory 300. The GPU 140 is specialized for processing of the graphic data and may process the graphic data in parallel.

The GPU 140 may compress the raw data or source data 10 to generate new source data 10 or update the source data 10, and may store it in the memory 300.

The display 150 may display the source data 10 stored in the memory 300 on a screen. The display 150 may display an image data processed by another multi-media IP 100, that is, the image signal processor 110, the image stabilization module 120, the multi-format codec 130 and the GPU 140, that is, the source data 10, on the screen. However, example embodiments are not limited thereto.

The image signal processor 110, the image stabilization module 120, the multi-format codec 130, the GPU 140 and the display 150 of the multi-media IP 100 may each operate individually. That is, each of the image signal processor 110, the image stabilization module 120, the multi-format codec 130, the GPU 140 and the display 150 may individually access the memory 300 to read or write the data.

The frame buffer compressor 200 compresses the source data 10 and convert it into compressed data 20 before the multi-media IP 100 individually accesses the memory 300. The frame buffer compressor 200 may send compressed data 20 to the memory 300.

Accordingly, the compressed data 20 compressed by the frame buffer compressor 200 may be stored in the memory 300. On the contrary, the compressed data 20 stored in the memory 300 may be sent to the frame buffer compressor 200 when loaded by the multi-media IP 100. The frame buffer compressor 200 may decompress the compressed data 20 and convert it into the output data 30. The frame buffer compressor 200 may send the output data 30 to the multi-media IP 100 again. Although the output data 30 needs to be the same as the source data 10 in principle, it may change during the compression and decompression process.

Each time the image signal processor 110, the image stabilization module 120, the multi-format codec 130, the GPU 140 and the display 150 of the multi-media IP 100 individually access the memory 300, the frame buffer compressor 200 may compress the source data 10 into compressed data 20 and transmit it to the memory 300. On the contrary, each time there is a raw data request on the image signal processor 110, the image stabilization module 120, the multi-format codec 130, the GPU 140 and the display 150 of the multi-media IP 100 from the memory 300, the frame buffer compressor 200 may decompress the compressed data 20 into the output data 30, and send the output data to the components of the multi-media IP 100 which request the raw data.

The memory 300 may store the compressed data 20 generated by the frame buffer compressor 200, and may provide the stored compressed data 20 to the frame buffer compressor 200 so that the frame buffer compressor 200 can decompress the stored compressed data 20.

The frame buffer compressor 200 and the memory 300 may be connected to the system bus 400, respectively. For example, the image signal processor 110, the image stabilization module 120, the multi-format codec 130, the GPU 140 and the display 150 of the multi-media IP 100 may be individually connected to the system bus 400 through the frame buffer compressor 200.

Referring to FIG. 2, the frame buffer compressor 200 may include an encoder 210 and a decoder 220.

The encoder 210 may receive the source data 10 from the multi-media IP 100 to generate the compressed data 20. At this time, the source data 10 may be sent from the image signal processor 110, the image stabilization module 120, the multi-format codec 130, the GPU 140, and the display 150 of the multi-media IP 100, respectively. The compressed data 20 may be sent to the memory 300 through the multi-media IP 100 and the system bus 400.

On the contrary, the decoder 220 may decompress the compressed data 20 stored in the memory 300 into the output data 30. The output data 30 may be transmitted to the multi-media IP 100. At this time, the output data 30 may be transmitted to the image signal processor 110, the image stabilization module 120, the multi-format codec 130, the GPU 140 and the display 150 of the multi-media IP 100, respectively.

Figure 3:
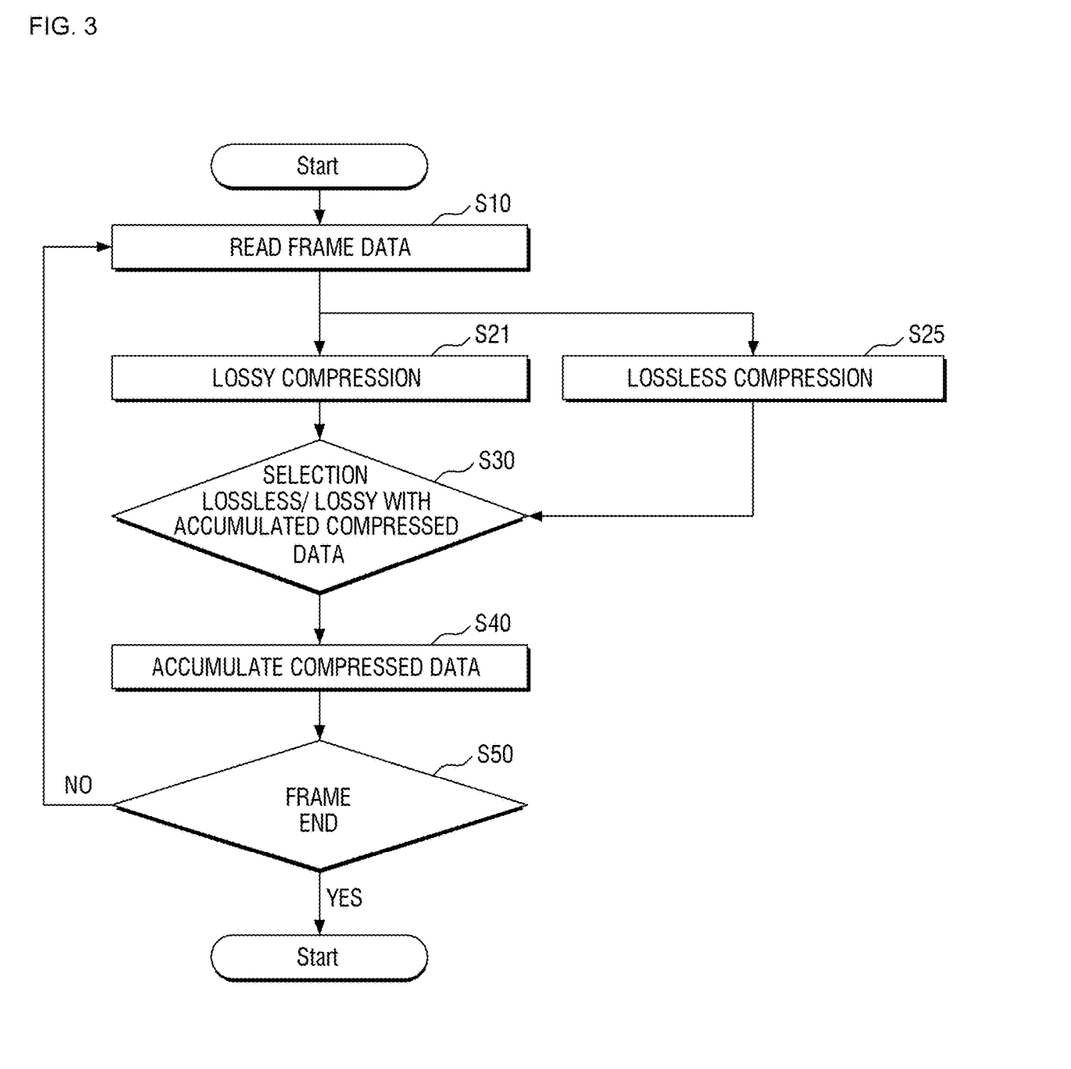
FIG. 3 is a flowchart showing an operating method of the encoder of FIG. 2.
Figure 4:
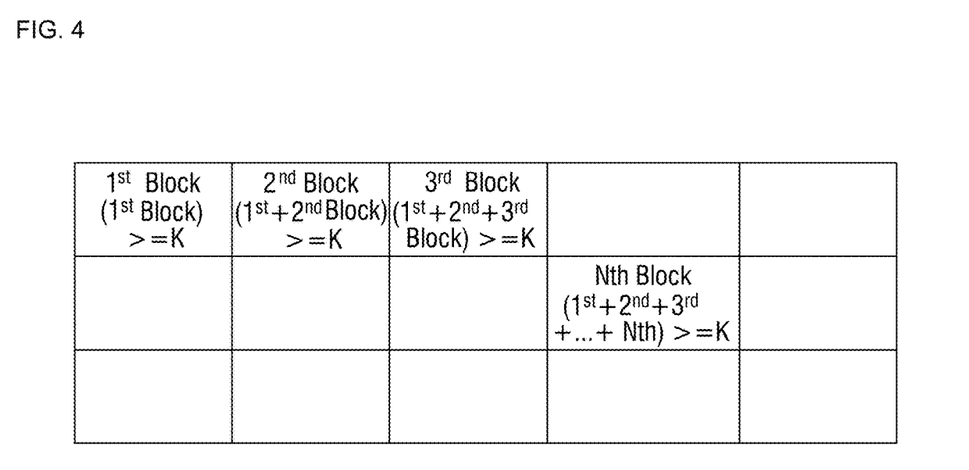
FIG. 4 is a diagram showing a unit block included in a single frame of the source data.
Figure 5:
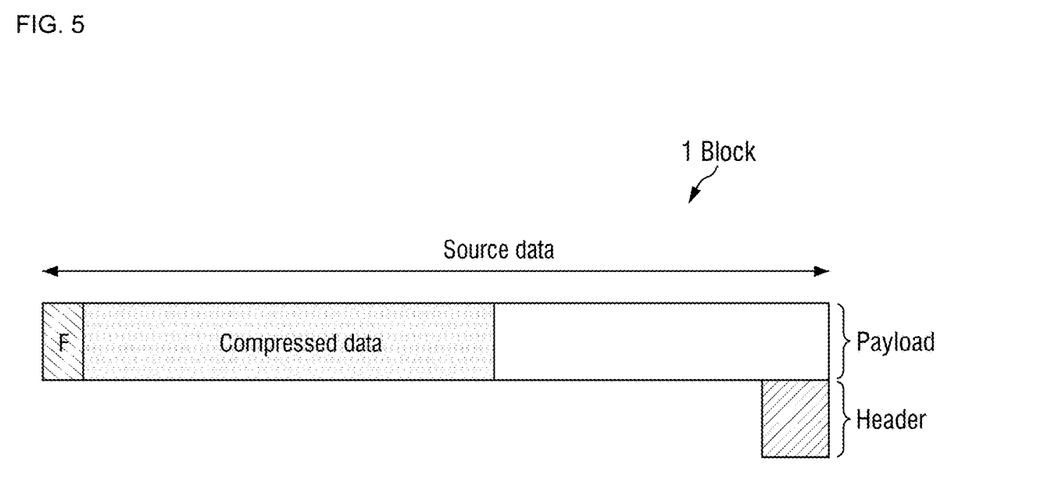
FIG. 5 is a diagram showing a unit block of FIG. 4.
Figure 6:
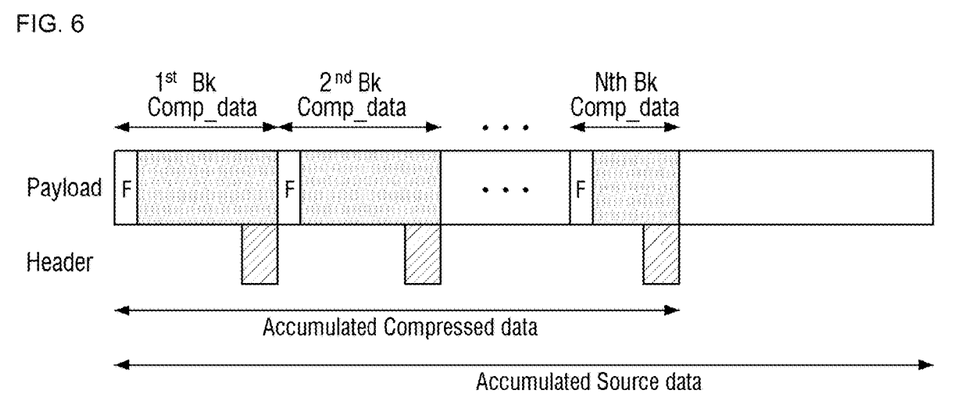
FIG. 6 is a diagram showing a plurality of unit blocks of FIG. 4.

FIG. 3 is a flowchart showing an operating method of the encoder of FIG. 2, FIG. 4 is a diagram showing a unit block included in a single frame of the source data, FIG. 5 is a diagram showing a unit block of FIG. 4, and FIG. 6 is a diagram showing a plurality of unit blocks of FIG. 4. The following description will be provided referring to FIGS. 3 to 6.

The encoder 210 of the frame buffer compressor 200 first receives the source data 10 on a frame basis (S10). The encoder 210 may compress the source data 10 in a lossy compression mode (S21) and may compress the source data 10 in a lossless compression mode (S25). The source data 10 includes at least two frames, and each frame may include at least two blocks arranged in rows and columns.

The encoder 210 may compare an accumulated compressibility of at least two or more compressed data with a reference compressibility (S30). The compressed data may be lossless compressed data or lossy compressed data. Lossless compression means compression without data loss, and means a type in which the compressibility changes depending on the data. On the contrary, lossy compression is compression in which some of data are lost, has a higher compressibility than the lossless compression, and may have a preset fixed compressibility.

If the accumulated compressibility of the lossy compressed source data S21, S30 is smaller than the reference compressibility, the encoder 210 selects the lossy path and outputs the lossy compressed data (S40). However, when the accumulated compressibility of the lossy compressed source data S21, S30 is greater than the reference compressibility, the encoder 210 may select a lossless path and output the lossless compressed data (S40).

At this time, the accumulated compressibility may be a value obtained by adding both the compressibility of at least two blocks requested by the multi-media IP 100. Also, the compressibility of each block may mean the percentage of the block compressed data among the total source data.

At least two blocks, which may be the basis for calculating the accumulated compressibility, may be included in a column, that is, a line unit, according to some example embodiments. Or, the at least two blocks, which may be the basis for the accumulated compressibility, may be at least one block unit according to some example embodiments. The at least two blocks, which may be the basis for the accumulated compressibility, may be at least two or more blocks arranged consecutively among a plurality of blocks, or randomly arranged at least two or more blocks, according to some example embodiments.

It is assumed that if the lossless compressed data in each block is smaller than the reference compressibility, the lossless path is selected, and if the lossless compressed data is larger than the reference compression, the lossy path is selected. In some example embodiments, since the compressibility is calculated independently for each block, the overall compressibility may increase. However, if the compressibility in a particular block is low and the compressed data is greater than the reference compressibility, when selecting the lossy path on the basis of the original rules, an image quality degradation due to that particular block may occur.

Therefore, if the total compressibility of each block, that is, the accumulated compressibility is compared with the reference compressibility, it is possible to reduce or prevent the image quality deterioration of only a particular block, and the number of blocks that are processed as the lossy compression and lost as a whole may also be reduced.

A specific explanation thereof will be provided referring to FIG. 4. It is assumed that one frame includes fifteen blocks of 5×3 according to some example embodiments.

In the shown example, the first block is a lossy compressed or lossless compressed $1^{st}$ block. The accumulated compressibility of the first block and the second block is a value ($=1^{st}+2^{nd}$ Block) obtained by adding the $1^{st}$ Block calculated above to the lossy compressed or lossless compressed $2^{nd}$ block of the second block. The accumulated compressibility from the first block to the third block is a value ($=1^{st}+2^{nd}+3^{rd}$ Block) obtained by adding the accumulated value ($1^{st}+2^{nd}$ Block) calculated above to the lossy compressed or lossless compressed $3^{rd}$ Block of the third block. The accumulated compressibility in each block such as the fourth block and the fifth block may be calculated in the same way, and in the case of the Nth block, the value ($=1^{st}+2^{nd}+3^{rd}+\ldots+$Nth) obtained by adding compressibility from the first block to the Nth block may be the accumulated compressibility of the Nth block.

The accumulated compressibility thus calculated is compared with the reference compressibility K, and the encoder 210 may determine whether to select the lossy path or the lossless path depending on the comparison result.

The reference compressibility K is a compressibility defined on the basis of the bandwidth of the system bus 400 which connects the frame buffer compressor 200 and the memory 300, and is a value that may be changed depending on the design. As an example, the reference compressibility K may be defined to 50% of the bandwidth of the system bus 400 depending on the arrangement of the multi-media IP 100 and the frame buffer compressor 200, and may be defined to 40% as another example, or may be defined to 60% as still another example.

Referring to FIG. 5, according to some example embodiments, the compressed data 20 corresponding to each block included in the frame may include a payload and a header.

The payload includes a flag, actual compressed data and values required for decompression. The header is a portion indicating the compressibility of the compressed data 20 and may be stored as a header index.

According to some example embodiments, there may be a case where the source data 10 is M times a burst length BL (M is a natural number). At this time, the header index may include M/2 bits. According to some example embodiments, the header index may indicate the compressed size of the compressed data. The encoder 210 may read only the compressed size on the basis of the header index and reduce the actually used bandwidth.

The compressed data 20 may become shorter than the source data 10. At this time, the payload may include a flag F indicating whether the compressed data 20 is due to the lossy path or the lossless path. The flag is 1 bit and may be included in the compressed data 20. For example, in the case of 0, it may indicate the lossy path, and in the case of 1, it may indicate the lossless path, and opposite cases are also possible according to another example.

Referring to FIGS. 4 and 6, a plurality of blocks is included in a single frame, and the compressed data of each block includes a payload and a header. The accumulated compressibility may be an accumulated sum value of the compressibility of the compressed data (1st Bk Comp_data) of at least one requested block. In some example embodiments, as shown, the header exists separately from the compressed data, and the length of the header or the like does not affect calculation of the accumulated compressibility.

The encoder 210 may repeatedly perform operations S20 to S40 for the requested number of blocks until the end of one frame (S50).

Figure 7:
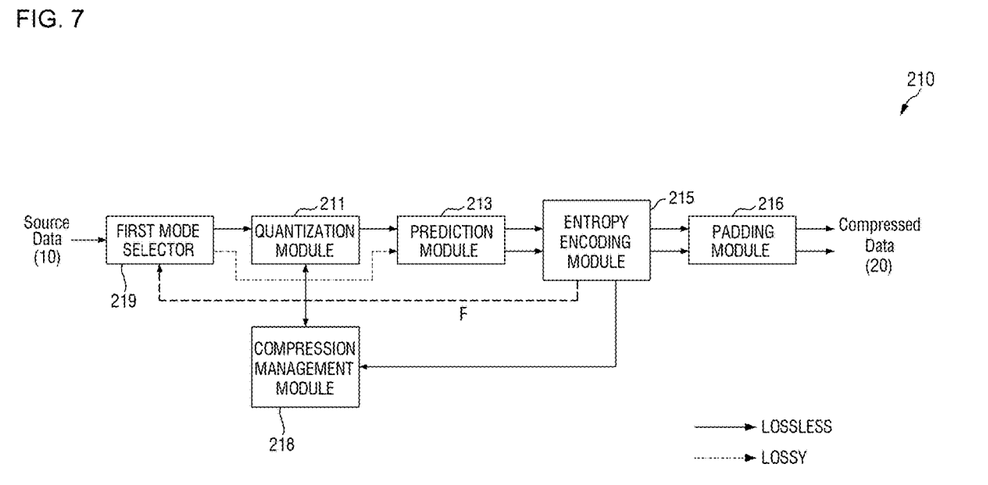
FIG. 7 is a block diagram for specifically explaining the encoder of FIG. 2 according to some example embodiments.

FIG. 7 is a block diagram for specifically explaining the encoder of FIG. 2 according to some example embodiments.

Referring to FIG. 7, the encoder 210 includes a first mode selector 219, a quantization module 211, a prediction module 213, an entropy encoding module 215, a padding module 216, and a compression management module 218.

The first mode selector 219 may determine whether the encoder 210 operates in a lossless mode or a lossy mode on the basis of the control signal of the entropy encoding module 215. When the encoder 210 operates in the lossless mode, the source data 10 may be compressed along the lossless path (Lossless) of FIG. 3. When the encoder 210 operates in the lossy mode, the source data 10 may be compressed along the lossy path (Lossy).

The first mode selector 219 may receive a signal that determines whether to perform a lossless compression or a lossy compression from the multi-media IP 100. At this time, the lossless compression means a compression without data loss, and means a type in which the compressibility changes depending on the data. On the contrary, the lossy compression is a compression in which some of data are lost, has a higher compressibility than the lossless compression, and may have a preset fixed compressibility.

When the encoder 210 operates in the lossless mode, the first mode selector 219 may induce the data flow to the prediction module 213, the entropy encoding module 215 and the padding module 216 along the lossless path (Lossless). When the encoder 210 operates in the lossy mode, the first mode selector 219 may include the data flow to the quantization module 211, the prediction module 213 and the entropy encoding module 215 along the lossy path (Lossy).

As an example, when the encoder 210 operates in the lossless mode, the first mode selector 219 may transmit the source data 10, which is input to the encoder 210, to the prediction module 213. As another example, when the encoder 210 operates in the lossy mode, the first mode selector 219 may transmit the source data 10, which is input to the encoder 210, to the quantization module 211.

The quantization module 211 may perform quantization on the source data 10 that is input to the frame buffer compressor 200 by the use of a predefined or desired quantization coefficient to generate reconstituted data. For example, the quantization module 211 may quantize each of the plurality of source pixel data with a predefined or desired quantization coefficient to generate reconstituted data.

Data removed while performing the quantization may not be restored later. Therefore, the quantization module 211 may be utilized only in the lossy mode. However, the lossy mode may have a relatively high compressibility as compared with the lossless mode, and may have a preset fixed compressibility.

The compressed data 20 may include the quantization coefficient used by the quantization module 211. For example, the encoder 210 may add the quantization coefficient used in the quantization module 211 to the compressed data 20.

The prediction module 213 may perform intra-prediction on the source data 10 or the reconstituted data to generate the prediction data. According to some example embodiments, the prediction data may be separate data obtained by reducing the size of a plurality of reconstituted data. As an example, the prediction module 213 may reduce the size of data by expressing some of a plurality of recon pixel data with residual pixel data.

The prediction module 213 may compress the size of the data, by generating prediction data including the reference pixel data and the residual pixel data from the source data 10 or reconstituted data. Also, the prediction module 213 may perform intra-prediction on a plurality of source pixel data of source data 10 or a plurality of recon pixel data of reconstituted data on a pixel basis to generate prediction data.

The quantization module 211 and the prediction module 213 according to some example embodiments of the present application may perform the quantization and intra-prediction in parallel for each of a plurality of source pixel data. For example, the quantization module 211 may perform quantization of all source pixel data at the same time to generate reconstituted data. Also, the prediction module 213 may generate prediction data including the reference pixel data and the prediction pixel data in parallel from the source data or reconstituted data. In this way, according to some example embodiments of the present inventive concepts, the quantization module 211 and the prediction module 213 may perform quantization and intra-prediction in parallel, respectively.

The entropy encoding module 215 may perform the entropy encoding on the prediction data compressed by the prediction module 213 to generate entropy data. The entropy encoding module 215 calculates the compressibility of the generated entropy data and compares it with the reference compression to output the control signal, which becomes the basis of selection of the lossy path or the lossless path, to the first mode selector 219. That is, it may correspond to operation S30 of FIG. 3.

According to some example embodiments, the entropy encoding module 215 may determine the entropy pixel data on the basis of the entropy frequency.

Also, the entropy encoding module 215 may perform the entropy encoding on the prediction data generated from the source data 10 to generate entropy data.

In some example embodiments, the entropy encoding module 215 may compress the prediction data, using Huffman coding. Also, the entropy encoding module 215 may compress the prediction data through exponential Golomb coding or Golomb Rice coding.

The padding module 216 may perform padding on the entropy data generated by the entropy encoding module 215 to generate the padding data. For example, the padding module 216 may add meaningless data (e.g., zero data) to the entropy data to generate padding data having a predefined or desired size.

As an example, when the encoder 210 operates in the lossy mode, the size of the padding data may be defined on the basis of the size of the source data and the fixed compressibility. For example, for example, when the size of the source data 10 is 100 and the fixed compressibility is 50%, the size of the padding data may be defined as 50. On the other hand, the size of the entropy data compressed by the quantization module 211, the prediction module 213, and the entropy encoding module 215 may be smaller than 50. In some example embodiments, the padding module 216 may add zero data to the entropy data to generate padding data having a predefined or desired size of 50.

As another example, when the encoder 210 operates in the lossless mode, the size of the padding data may be defined on the basis of the size of the source data. For example, for example, when the size of the source data 10 is 100, the size of the padding data may be defined as 100. On the other hand, the size of the entropy data compressed by the prediction module 213 and the entropy encoding module 215 may be smaller than 100. In some example embodiments, the padding module 216 may add zero data to the entropy data to generate padding data having a predefined or desired size of 100.

In this way, the padding module 216 may generate padding data having a predefined or desired size from the entropy data compressed by other modules of the encoder 210. The encoder 210 may output the padding data as compressed data 20. That is, the compressed data 20 stored in the memory 300 may have a certain size by the padding module 216.

The compression management module 218 may control the compression of the source data 10 in the quantization module 211 and the entropy encoding module 215 on the basis of the determined quantization coefficient and entropy table.

The compression management module 218 may determine the quantization coefficient used in the quantization module 211. For example, when the encoder 210 operates in the lossy mode, the source data 10 is compressed along the lossy path (Lossy) of FIG. 3. At this time, the compression management module 218 may include a QP table including the quantization coefficient. For example, the QP table may include one or more entries, and each entry may include the quantization coefficient used in the quantization module 211.

Also, the compression management module 218 may determine an entropy table that represents the entropy pixel data of the entropy frequency used for each entropy encoding. For example, the compression management module 218 may include an entropy table. The entropy table means a plurality of code tables identified through the value of k to perform an entropy encoding algorithm, and the entropy table that may be used in some example embodiments of the present inventive concepts may include at least one of an exponential Golomb code and a Golomb Rice code.

After that, the frame buffer compressor 200 may write the compressed data 20 generated from the encoder 210 on the memory 300. Further, the frame buffer compressor 200 may read the compressed data 20 from the memory 300, decompress the read compressed data 20, and provide it to the multi-media IP 100.

Figure 8:
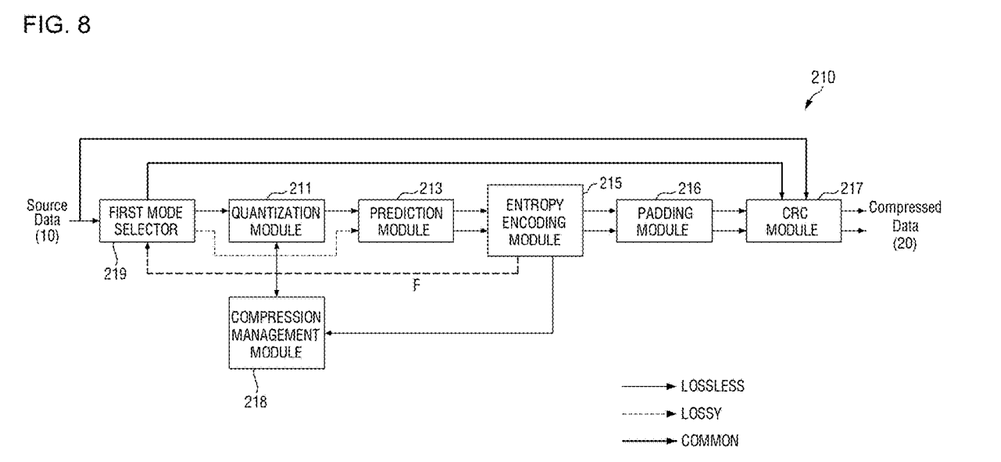
FIG. 8 is a block diagram for specifically explaining the encoder of FIG. 2 according to some example embodiments.

FIG. 8 is a block diagram for specifically explaining the encoder of FIG. 2 according to some example embodiments. For convenience of explanation, differences from FIG. 7 will be mainly explained.

Referring to FIG. 8, according to some example embodiments, the encoder 210 may further include a CRC (cyclical redundancy check) module 217.

The CRC module 217 may directly receive the source data 10 that is not compressed by the previous modules. The CRC module 217 may perform CRC calculation by polynomials stored in advance, and generate CRC bits through this. The CRC bits are attached to the compressed data 20 later, and may be used as a means for checking whether there is an error in the process of compression and decompression when the compressed data 20 is decompressed later and becomes the output data 30.

Figure 9:
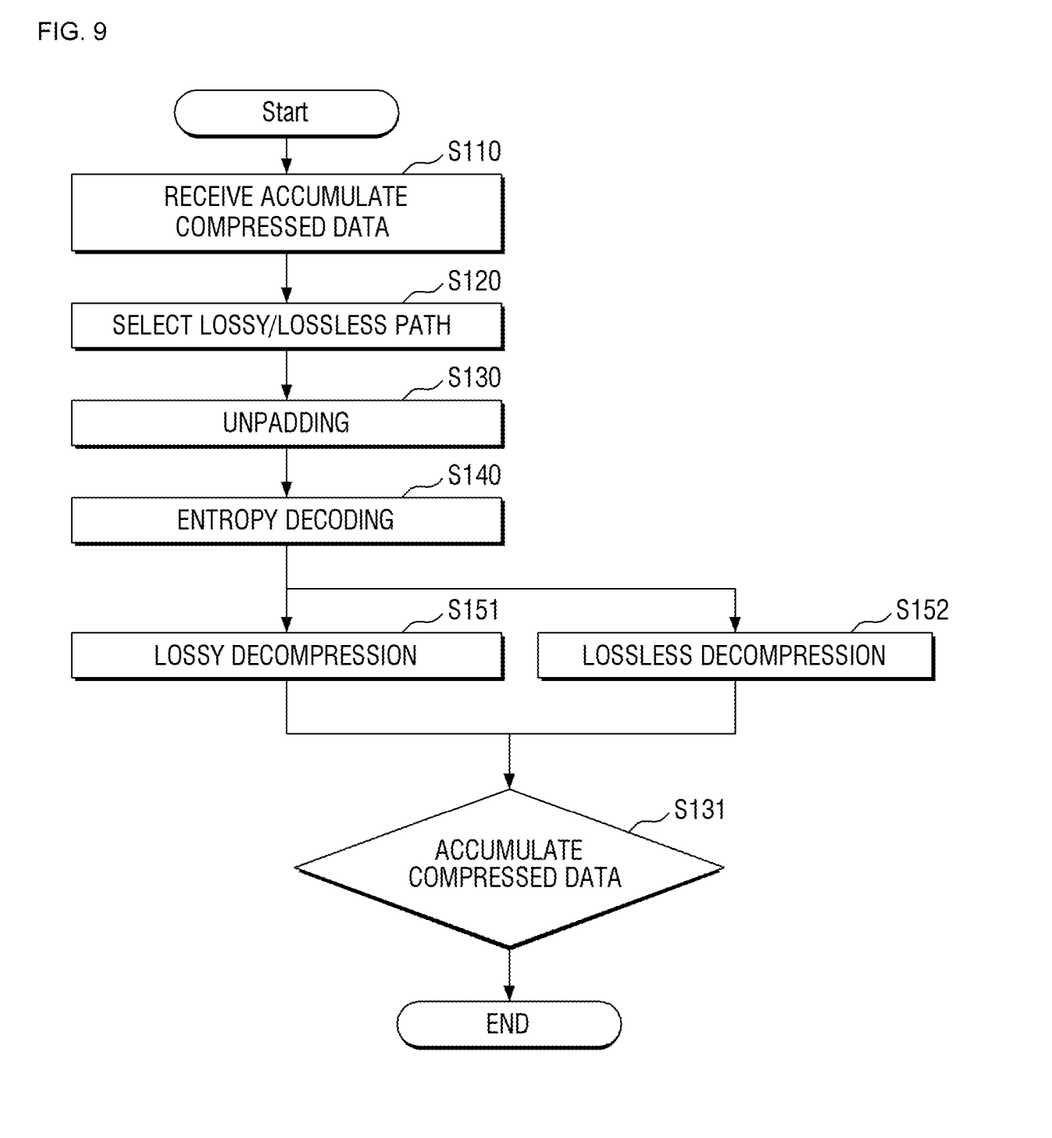
FIG. 9 is a flowchart showing the operating method of the decoder of FIG. 2.

FIG. 9 is a flowchart showing the operating method of the decoder of FIG. 2.

Referring to FIG. 9, the decoder 220 may receive the accumulated compressed data according to some example embodiments (S110). The decoder 220 checks the flag F on the received compressed data 20 to determine whether to select the lossless path or the lossy path (S120).

In the case of the lossy path, the decoder 220 may perform unpadding of zero data along the lossy path from the padding data having a predefined or desired size (S130). In the case of the lossless path, the decoder 220 may perform unpadding of zero data along the lossless path from the padding data having a predefined or desired size (S130).

The decoder 220 may perform entropy-decoding of the unpadded entropy data (S140). For example, entropy decoding may extract prediction data from entropy data through Huffman coding, exponential Golomb coding or Golomb Rice coding.

The decoder 220 may perform lossy path decompression (S151) or lossless path decompression (S152) on the extracted prediction data. The lossy path decompression S151 may perform inverse quantization after performing the prediction compensation on the inverse prediction data. The inverse quantization may perform the inverse quantization on the prediction compensation data by the use of the quantization coefficient of the compressed data, and output the result as output data.

Figure 10:
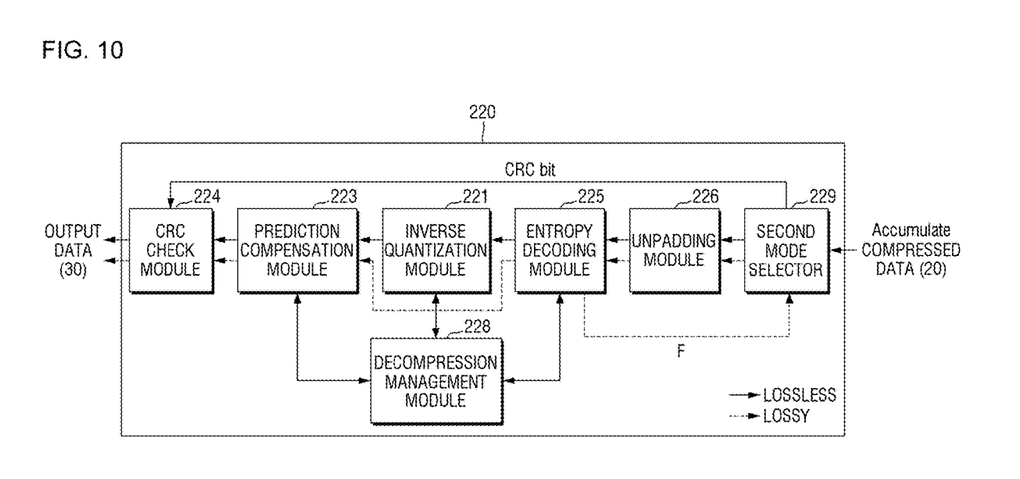
FIG. 10 is a block diagram for specifically explaining the decoder of FIG. 2 according to some example embodiments.

FIG. 10 is a block diagram for specifically explaining the decoder of FIG. 2 according to some example embodiments.

Referring to FIG. 10, the decoder 220 includes a second mode selector 229, an unpadding module 226, an entropy decoding module 225, a prediction compensation module 223, and an inverse quantization module 221.

The second mode selector 229 may select whether the compressed data 20 stored in the memory 300 is lossless-compressed or lossy-compressed. As an example, as shown in FIGS. 5 and 6, the second mode selector 229 may determine whether the compressed data 20 is compressed by which mode of the lossless mode or the lossy mode through the flag F of compressed data.

In the case of lossless mode, the second mode selector 229 may induce the compressed data 20 to the unpadding module 226, the entropy decoding module 225 and the prediction compensation module 223 along a lossless path (Lossless). On the contrary, in the case of lossy mode, the second mode selector 229 may induce the compressed data 20 to the unpadding module 226, the entropy decoding module 225, the prediction compensation module 223, and the inverse quantization module 221 along the lossy path (Lossy).

The unpadding module 226 may remove meaningless data (e.g., zero data) added by the padding module 216 of the encoder 210. For example, the unpadding module 226 may remove zero data from the compressed data 20 to generate entropy data. The entropy data generated by the unpadding module 226 may be transmitted to the entropy decoding module 225.

The entropy decoding module 225 may decompress the data compressed by the entropy encoding module 215 of the encoder 210. That is, the entropy decoding module 225 may generate prediction data from the entropy data transmitted from the unpadding module 226.

According to some example embodiments, the entropy decoding module 225 may generate residual pixel data and reference pixel data corresponding to each of the entropy pixel data, using the entropy table. That is, the entropy decoding module 225 may generate prediction data including the residual pixel data and reference pixel data. The prediction data generated from the entropy decoding module 225 may be transmitted to the prediction compensation module 223.

In some example embodiments, the entropy decoding module 225 may perform decompression through Huffman coding, exponential Golomb coding or Golomb Rice coding. The Huffman coding, the exponential Golomb coding or the Golomb Rice coding may be commonly used techniques, and the details thereof will be omitted.

According to some example embodiments, the entropy decoding module 225 checks the flag F included in the compressed data and may notify the second mode selector 299 of the flag, when generating the prediction data from the entropy data. According to an example, after performing both the decompression according to the lossy mode and the decompression according to the lossless mode, it is also possible to notify the second mode selector 299 of the flag and to cause the second mode selector 299 to select one of the two results. According to another example, after the second mode selector 299 selects one of the lossy mode or the lossless mode by the flag, it is also possible to perform the decompression along the selected path.

The prediction compensation module 223 may perform intra-prediction compensation on the prediction data to decompress the prediction data transmitted from the entropy decoding module 225. That is, the prediction compensation module 223 may perform intra-prediction compensation on the prediction data to generate reconstituted data or the output data 30. For example, if the compressed data 20 is compressed in the lossy mode, the prediction compensation module 223 may generate reconstituted data and transmit it to the inverse quantization module 221. Further, when the compressed data 20 is compressed in the lossless mode, the prediction compensation module 223 may generate the output data 30. In some example embodiments, the decoder may transmit the output data 30 to the multi-media IP 100.

For example, the prediction compensation module 223 may perform intra-prediction by the prediction module 213 in inverse order to decompress the prediction data. The prediction data may include a plurality of prediction pixel data. Each of the plurality of prediction pixel data may be reference pixel data or residual pixel data.

As an example, the prediction compensation module 223 may generate a plurality of recon pixel data, using the reference pixel data or the residual pixel data. For example, the prediction compensation module 223 may generate recon pixel data corresponding to the reference pixel data, using the reference pixel data. Further, the prediction compensation module 223 may generate recon pixel data corresponding to the residual pixel data, using the reference pixel data and the residual pixel data. As explained above, the prediction compensation module 223 may transmit reconstituted data including a plurality of recon pixel data to the inverse quantization module 221.

As another example, the output data 30 may include the output pixel data corresponding to each of the plurality of prediction pixel data. The prediction compensation module 223 may generate a plurality of output pixel data, using the reference pixel data or the residual pixel data. For example, the prediction compensation module 223 may generate output pixel data corresponding to the reference pixel data, using the reference pixel data. Further, the prediction compensation module 223 may generate output pixel data corresponding to the residual pixel data, using the reference pixel data and the residual pixel data. As explained above, the decoder 220 may transmit the output data 30 including a plurality of output pixel data to the multi-media IP 100.

In this way, the prediction compensation module 223 may restore the intra-prediction performed pixel on a pixel basis according to the prediction module 213.

In the case of the lossy mode, the inverse quantization module 221 may generate the output data 30 from the quantization coefficient from the compressed data 20 and the reconstituted data transmitted from the prediction compensation module 223. That is, the inverse quantization module 221 may perform the inverse quantization on the reconstituted data using the quantization coefficient and generate the output data 30 as a result. For example, the reconstituted data may include a QP table determined by the compression management module 218 of the encoder 210. The inverse quantization module 221 may determine the quantization coefficient from the QP table.

For example, the output data 30 may include a plurality of output pixel data corresponding to each of the plurality of recon pixel data. The output pixel data may be generated by performing the inverse quantization on the corresponding recon pixel data. For example, the output pixel data may be generated by multiplying the corresponding recon pixel data by a quantization coefficient.

In this way, the inverse quantization module 221 may generate output data 30 from reconstituted data. At this time, the output data 30 generated by the inverse quantization module 221 may be different from the source data 10 that is input to the encoder 210. This is because when the quantization module 211 of the encoder 210 performs the quantization on the source data 10, the data smaller than the quantization coefficient may be lost and not restored. Therefore, the inverse quantization module 221 may be utilized only in the lossy mode.

The decompression management module 228 may perform an operation in which a combination of the QP table and the entropy table determined to perform the compression of the source data 10 by the compression management module 218 described above in relation to FIG. 8 may be appropriately reflected when decompressing the compressed data 20.

On the other hand, although not shown, the decoder 220 may further include a CRC check module behind the inverse quantization module 221.

The CRC check module 224 may receive the CRC bit from the second mode selector 229. The CRC check module 224 may perform CRC calculation by pre-stored polynomials on the output data 30 decompressed by the previous module to generate comparative CRC bits.

The CRC check module 224 may compare the CRC bit with the comparison CRC bit each other. If the CRC bit and the comparison CRC bit are the same as each other, the output data 30 may be exactly the same as the source data 10. That is, in such example embodiments, it may be confirmed that there is no error in the process of compression and decompression.

On the contrary, if the CRC bit and the comparison CRC bit are different from each other, the output data 30 may be different from the source data 10. That is, in such example embodiments, it may be confirmed that an error occurs in the process of compression and decompression. The CRC check module 224 may perform error marking on the output data 30 in such example embodiments. The error marking may be a display that allows the user to know that an error occurs in the process of compression or decompression. For example, a CRC check module 224 may assign a specific color to the output data 30 so that the user knows that a specific color part is an error part.

Figure 11:
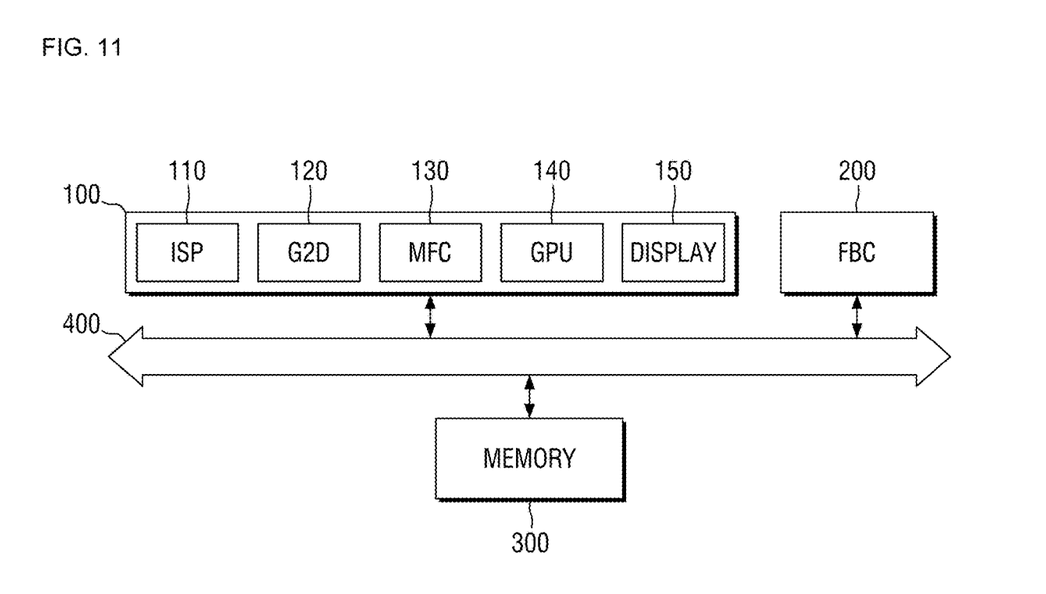
FIG. 11 is a block diagram for explaining the image processing apparatus according to some example embodiments of the present inventive concepts.

Hereinafter, the image processing apparatus according to some example embodiments of the present inventive concepts will be described referring to FIG. 11. The explanation of same parts of the aforementioned contents will be simplified or omitted. FIG. 11 is a block diagram for explaining the image processing apparatus according to some example embodiments of the present inventive concepts.

Referring to FIG. 11, the frame buffer compressor 200, the multi-media IP 100, and the memory 300 of the image processing apparatus according to some example embodiments of the present inventive concepts may each be directly connected to the system bus 400.

The frame buffer compressor 200 is not directly connected to the multi-media IP 100 but may be connected to the multi-media IP through the system bus 400. For example, the multi-media IP 100 may transmit data to and from the frame buffer compressor 200 through the system bus 400. That is, in the process of compression, the multi-media IP 100 may send the source data 10 to the frame buffer compressor 200 through the system bus 400. Subsequently, the frame buffer compressor 200 may generate the compressed data 20 from the source data 10, and may send it to the memory 300 again through the system bus 400.

Further, in the process of decompression, the compressed data 20 stored in the memory 300 is transmitted to the frame buffer compressor 200 through the system bus 400, and the compressed data 20 may be decompressed into the output data 30. Subsequently, the frame buffer compressor 200 may send the output data 30 to the multi-media IP 100 through the system bus 400.

According to some example embodiments, even if the frame buffer compressor is not connected individually to the image signal processor 110, the image stabilization module 120, the multi-format codec 130, the GPU 140 and the display 150 of the multi-media IP 100, because the frame buffer compressor may be connected thereto through the system bus, the hardware configuration may be simplified and/or the operating speed may be improved.

Figure 12:
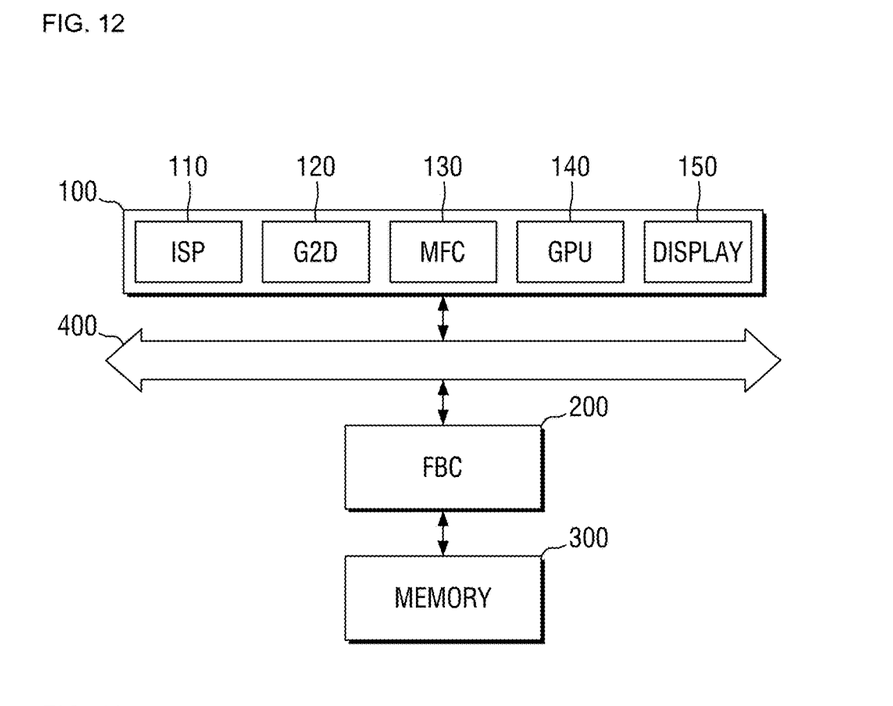
FIG. 12 is a block diagram for explaining an image processing apparatus according to some example embodiments of the present inventive concepts.

Hereinafter, the image processing apparatus according to some example embodiments of the present inventive concepts will be described referring to FIG. 12. The explanation of same parts of the aforementioned contents will be simplified or omitted. FIG. 12 is a block diagram for explaining an image processing apparatus according to some example embodiments of the present inventive concepts.

Referring to FIG. 12, in the image processing apparatus according to some example embodiments of the present inventive concepts, the system bus 400 is directly connected to the multi-media IP 100 and the frame buffer compressor 200, and the memory 300 may be connected to the system bus 400 through the frame buffer compressor 200.

That is, the memory 300 is not directly connected to the system bus 400, but may be connected to the system bus 400 only through the frame buffer compressor 200. Further, the image signal processor 110, the image stabilization module 120, the multi-format codec 130, the GPU 140 and the display 150 of the multi-media IP 100 may be directly connected to the system bus 400. Therefore, the image signal processor 110, the image stabilization module 120, the multi-format codec 130, the GPU 140 and the display 150 of the multi-media IP 100 may access the multi-media memory 300 only when going through the frame buffer compressor 200.

In some example embodiments, since the frame buffer compressor 200 is involved in all accesses to the memory 300, when the frame buffer compressor 200 is directly connected to the system bus 400, and the memory 300 is connected to the system bus 400 through the frame buffer compressor 200, it possible to reduce errors of data transmission and/or improve speed.

Figure 13:
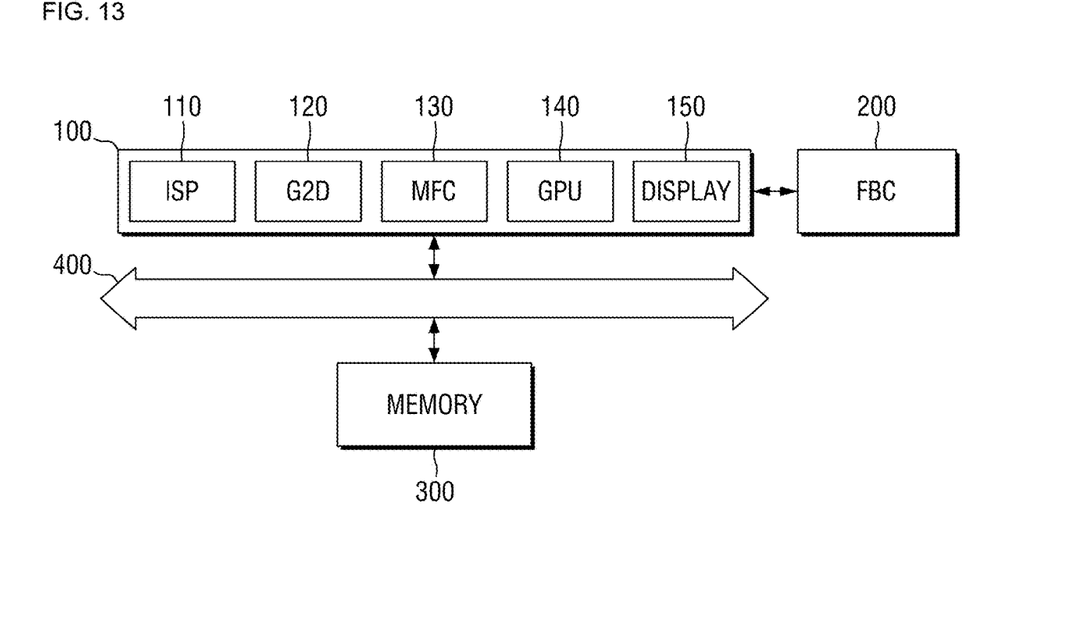
FIG. 13 is a block diagram for explaining the image processing apparatus according to some example embodiments of the present inventive concepts.

Hereinafter, the image processing apparatus according to some example embodiments of the present inventive concepts will be described referring to FIG. 13. The explanation of same parts of the aforementioned contents will be simplified or omitted. FIG. 13 is a block diagram for explaining the image processing apparatus according to some example embodiments of the present inventive concepts.

Referring to FIG. 13, in the image processing apparatus according to some example embodiments of the present inventive concepts, the system bus 400 may be directly connected to the multi-media IP 100 and the memory 300. The frame buffer compressor 200 may be connected to the multi-media IP 100. The frame buffer compressor 200 may receive source data 10 from the multi-media IP 100. The frame buffer compressor 200 may compress the source data 10 to generate compressed data 20, and may transmit it to the multi-media IP 100 again. The multi-media IP 100 may store the compressed data 20 in memory 300 through the system bus 400.

In the decompression process, the multi-media IP 100 may receive compressed data 20 from the memory 300 through the system bus 400. The multi-media IP 100 may transmit the compressed data 20 to the frame buffer compressor 200. The frame buffer compressor 200 may decompress the compressed data 20 to generate output data 30 and may transmit the output data to the multi-media IP 100 again.

Any of the elements disclosed above may include or be implemented in one or more circuitries such as hardware including logic circuits; a hardware/software combination such as a processor executing software; or a combination thereof. For example, the circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications may be made to the preferred example embodiments without substantially departing from the principles of the present inventive concepts. Therefore, the disclosed preferred example embodiments of the inventive concepts are used in a generic and descriptive sense only and not for purposes of limitation.

What is claimed is:

1. An image processing apparatus comprising:
a multi-media Intellectual Property (IP) core configured to process raw data to generate source data, and receives and uses output data;
frame buffer compressing circuitry configured to operate in a lossy mode or a lossless mode to compress the source data into compressed data or decompress the compressed data into the output data; and
a memory configured to store the compressed data and is accessed by the multi-media Intellectual Property (IP) core,
wherein the frame buffer compressing circuitry is configured to select the lossy mode or the lossless mode based on an accumulated compressibility of the compressed data and a reference compressibility, and
perform compression or decompression based on the selected mode,
wherein the accumulated compressibility is an accumulated sum of a compression rate of each individual block, and
wherein the reference compressibility is a desired value based on a bandwidth of a system bus.

2. The image processing apparatus of claim 1, wherein the source data includes at least one frame including a plurality of blocks, and
wherein the frame buffer compressing circuitry is configured to operate in the lossy mode when the accumulated compressibility of at least two blocks among the plurality of blocks exceeds a reference compressibility, and otherwise, the frame buffer compressing circuitry is configured to operate in the lossless mode.

3. The image processing apparatus of claim 2, wherein at least two blocks which are a basis of the accumulated compressibility include all the plurality of blocks.

4. The image processing apparatus of claim 2, wherein at least two blocks which are a basis of the accumulated compressibility are blocks included in at least one line among the plurality of blocks.

5. The image processing apparatus of claim 2, wherein at least two blocks which are a basis of the accumulated compressibility are at least two or more blocks continuously placed among the plurality of blocks.

6. The image processing apparatus of claim 2, wherein at least two blocks which are a basis of the accumulated compressibility are at least two or more blocks randomly placed among the plurality of blocks.

7. The image processing apparatus of claim 1, wherein the compressed data further includes:
a header which indicates a percentage of the compressed data in the bandwidth; and
a payload which includes a flag indicating whether the accumulated compressibility exceeds a reference compressibility, actual compressed data, and values required for the decompression.

8. Frame buffer compressing circuitry comprising:
encoder circuitry configured to receive source data and generates compressed data; and
decoder circuitry configured to decompress the compressed data and outputs the output data,
wherein the encoder circuitry is configured to perform compression in a lossy mode when an accumulated compressibility of the compressed data exceeds a reference compressibility, and otherwise, the encoder circuitry is configured to perform compression in a lossless mode,
wherein the decoder circuitry is configured to perform decompression according to a compression mode corresponding to the compressed data,
wherein the accumulated compressibility of the compressed data is an accumulated sum of a compression rate of each individual block, and
wherein the reference compressibility is a desired value based on a bandwidth of a system bus.

9. The frame buffer compressing circuitry of claim 8, wherein the compressed data includes:
a header which indicates a percentage of the compressed data in the bandwidth; and
a payload including flag, actual compressed data, and values required for the decompression.

10. The frame buffer compressing circuitry of claim 9, wherein the encoder circuitry includes
quantization circuitry configured to quantize the source data according to a quantization coefficient;
prediction circuitry configured to generate the source data or the quantized data as prediction data; and
entropy encoding circuitry configured to perform entropy encoding on the prediction data to generate entropy data, and
the entropy encoding circuitry is configured to calculate and accumulate compressibility of the source data on a block basis, and
the entropy encoding circuitry is configured to reflect a result obtained by comparing the accumulated compressibility of at least two or more blocks with the reference compressibility in the flag.

11. The frame buffer compressing circuitry of claim 10, wherein the encoder circuitry further includes first mode selector circuitry configured to select the lossy mode or the lossless mode on the basis of the flag provided by the entropy encoding circuitry, and
the first mode selector circuitry is in front of the quantization circuitry, and is configured to transmit the source data to the prediction circuitry when the lossy mode is selected, and is configured to transmit the source data to the quantization circuitry when the lossless mode is selected.

12. The frame buffer compressing circuitry of claim 10, wherein the encoder circuitry further includes a CRC (cyclical redundancy check) circuitry configured to add CRC bits generated on the basis of the source data to the compressed data.

13. The frame buffer compressing circuitry of claim 9, wherein the decoder circuitry includes:
second mode selector circuitry configured to select the lossy mode or the lossless mode depending on the flag;
entropy decoding circuitry configured to perform entropy-decoding of the compressed data;
prediction compensation circuitry configured to perform prediction compensation on the entropy-decoded data; and
inverse quantization circuitry configured to inversely quantize the prediction-compensated data and configured to output the prediction-compensated data as the output data in case of the lossy mode, wherein the prediction-compensated data is output as the output data in case of the lossless mode.

14. An image processing apparatus comprising:
a memory configured to store compressed data; and
a frame buffer compressing circuitry which includes encoder circuitry configured to compress at least some of source data to generate the compressed data and transmit the compressed data to the memory, and decoder circuitry configured to read and decompress the compressed data from the memory,
wherein the compressed data includes a payload and a header including actual compressed data and flag,
wherein the frame buffer compressing circuitry is configured to reflect a result obtained by comparing an accumulated compressibility corresponding to the compressed data with a reference compressibility in the flag, and is configured to perform compression or decompression in a lossy mode or a lossless mode depending on the flag,
wherein the accumulated compressibility is an accumulated sum of a compression rate of each individual block, and
wherein the reference compressibility is a desired rate based on a bandwidth of a system bus.

15. The image processing apparatus of claim 14, wherein the encoder circuitry includes
quantization circuitry configured to quantize the source data depending on a quantization coefficient;
prediction circuitry configured to generate the source data or the quantized data as prediction data; and
entropy encoding circuitry configured to perform entropy-encoding on the prediction data to generate entropy data,
wherein the entropy encoding circuitry is configured to calculate and accumulate compressibility of the entropy data on a block basis, and
the entropy encoding circuitry is configured to generate a result obtained by comparing the accumulated compressibility of at least two or more blocks with the reference compressibility as the flag.

16. The image processing apparatus of claim 15, wherein the encoder circuitry further includes first mode selector circuitry configured to cause the encoder circuitry to operate in the lossy mode or the lossless mode depending on the flag.

17. The image processing apparatus of claim 15, wherein at least two blocks which are a basis of the accumulated compressibility are blocks included in at least one line among a plurality of blocks of the source data.

18. The image processing apparatus of claim 15, wherein at least two blocks which are a basis of the accumulated compressibility are at least two or more blocks placed consecutively among a plurality of blocks of the source data.

19. The image processing apparatus of claim 14, wherein the decoder circuitry is configured to select the lossy mode or the lossless mode depending on the flag of the read compressed data,
the decoder circuitry is configured to perform unpadding of zero data of the compressed data,
the decoder circuitry is configured to perform entropy-decoding of the unpadded compressed date, and
when the lossy mode is selected, the decoder circuitry is configured to inversely quantize the decoded data and is configured to output the decoded data as output data, and
when the lossless mode is selected, the decoder circuitry is configured to output the decoded data as the output data.

20. The image processing apparatus of claim 19, wherein the header represents a percentage of compressed data in the bandwidth between the memory and the frame buffer compressing circuitry.

* * * * *